United States Patent [19]

Llewellyn

[11] Patent Number: 5,339,050

[45] Date of Patent: Aug. 16, 1994

[54] FREQUENCY SYNTHESIZING PHASE LOCK LOOP WITH UNVARYING LOOP PARAMETERS

[75] Inventor: William D. Llewellyn, San Jose, Calif.

[73] Assignee: National Semiconductor Corp., Santa Clara, Calif.

[21] Appl. No.: 53,628

[22] Filed: Apr. 27, 1993

[51] Int. Cl.$^5$ .................... H03L 7/089; H03L 7/107; H03L 7/18

[52] U.S. Cl. ........................................ 331/16; 331/17; 331/25

[58] Field of Search ...................... 331/1 A, 10, 16, 17, 331/23, 25, 34

[56] References Cited

U.S. PATENT DOCUMENTS

| | | | |
|---|---|---|---|
| 4,568,888 | 2/1986 | Kimura et al. | 331/10 |
| 4,743,867 | 5/1988 | Smith | 331/16 X |
| 4,980,653 | 12/1990 | Shepherd | 331/16 |
| 4,987,387 | 1/1991 | Kennedy et al. | 331/17 X |
| 5,128,632 | 7/1992 | Erhart et al. | 331/16 X |

Primary Examiner—David Mis
Attorney, Agent, or Firm—Steven F. Caserza

[57] ABSTRACT

A PLL frequency synthesizer utilizes circuitry for altering pump current magnitude based upon division factors in the PLL. In one embodiment, pump current magnitude is responsive to the feedback division factor path, providing a constant gain over a wide frequency range, thereby providing a constant natural frequency and damping. In another embodiment, pump current magnitude is controlled as a function of both feedback and feedforward division factors, thereby maintaining a constant natural frequency with respect to the output frequency. In another embodiment, the output frequency is proportional to the VCO control signal raised to a power, with charge pump current controlled as a function of the feedforward division factor thus providing a natural frequency and damping factor which is constant with respect to output frequency. In another embodiment, gain control is provided as a function of at least one division factor in a PLL loop which does not utilize a charge pump. In one embodiment, a gain control circuit provides a gain control signal to at least one of a phase comparator and the variable frequency oscillator. In another embodiment, a gain control circuit provides a gain control signal to at least one adjustable gain stage.

33 Claims, 6 Drawing Sheets

FREQUENCY SYNTHESIZING PHASE LOCK LOOP WITH UNVARYING LOOP PARAMETERS

INTRODUCTION

1. Background

This invention pertains to phase lock loop (PLL) circuits and more specifically to phase lock loop circuits for use in frequency synthesis. In particular, this invention pertains to such a phase lock loop frequency synthesizer which maintains a constant closed-loop natural frequency and damping ratio across a wide range of synthesized frequencies.

2. Description Of the Prior Art

Figure 1:
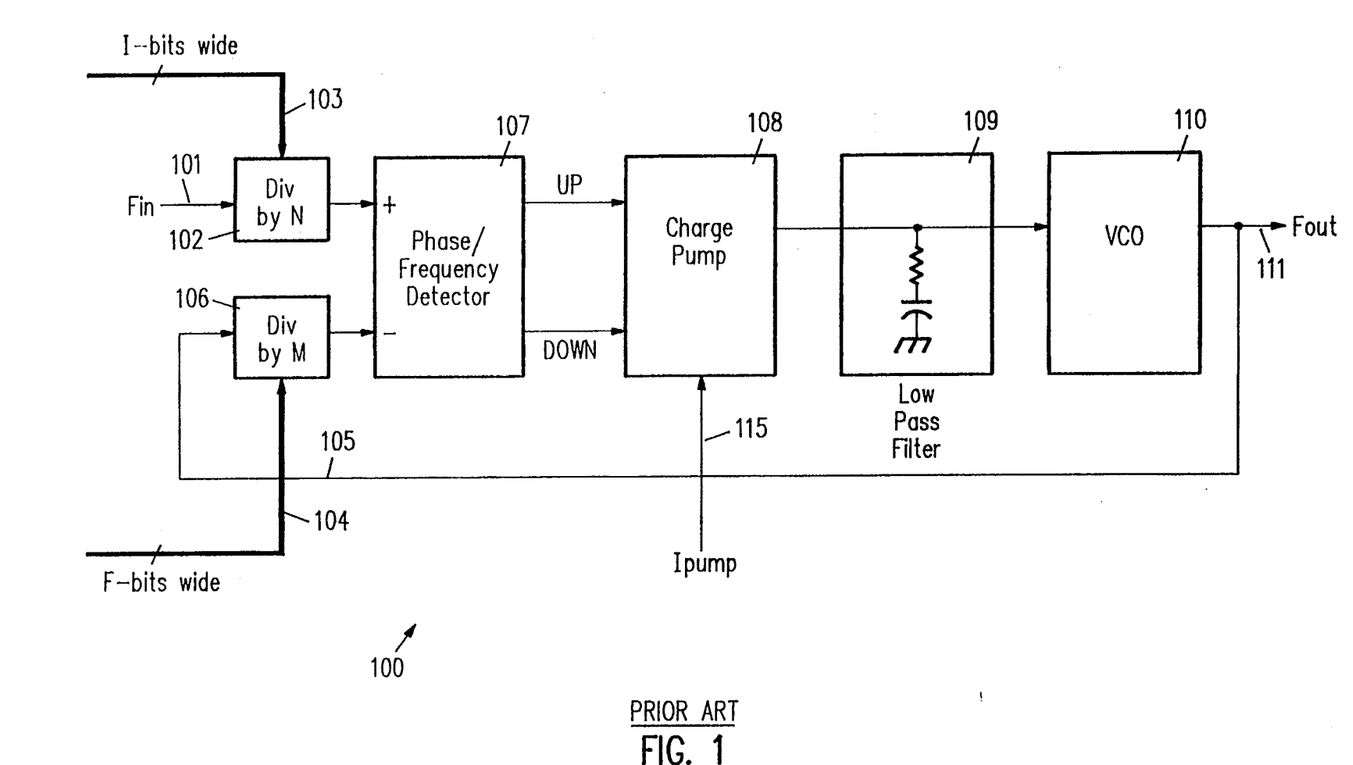
FIG. 1 is a block diagram of a typical prior art PLL frequency synthesizer circuit.

FIG. 1 is a schematic diagram of a typical well known phase lock loop (PLL) frequency synthesizer circuit 100. Circuit 100 receives a reference frequency $F_{in}$ on lead 101, for example from a crystal oscillator or other convenient source. This reference frequency $F_{in}$ is divided a factor of N by digital feedforward path divider 102, with the resultant signal of frequency $F_{in}/N$ applied to phase/frequency detector 107. The number N is, if desired, programmable by application to divider 101 of an appropriate digital word of I bits in width on bus 103.

Output frequency $F_{out}$ is made available to external circuitry on lead 111. Output frequency $F_{out}$ is also fed back via lead 105 to digital feedback divider 106, which divides output frequency $F_{out}$ by M and provides the resultant signal of frequency $F_{out}/M$ to phase/frequency detector 107. If desired, the number M is programmable by application of a digital word of F bits in width via bus 104. If desired, the programmable words made available on busses 103 and 104 are provided in any convenient manner, for example from digital logic circuits, a microcontroller, or the like as is well known in the art.

Phase/frequency detector 107 acts as a comparator and provides an up signal to charge pump 108 when the frequency $F_{in}/N$ of the feedforward signal made available to phase/frequency detector 107 by feedforward divider 102 is greater than the frequency $F_{out}/M$ of the feedback signal made available to phase/frequency detector 107 from feedback divider 106. Conversely, phase/frequency detector 107 issues a down signal when the feedback frequency $F_{out}/M$ is greater than the feedforward frequency $F_{in}/N$. Charge pump 108 sources current of magnitude $I_{pump}$ when phase/frequency detector 107 issues an up signal to charge pump 108 and conversely charge pump 108 sinks current of magnitude $I_{pump}$ when phase/frequency detector 107 issues a down signal to charge pump 108. The magnitude of this current $I_{pump}$ is established by external circuitry (not shown) which provides a current $I_{pump}$ to charge pump 108 via lead 115.

The result of the sourcing or sinking of current by charge pump 108 produces control voltage corrections at low pass filter 109, which provides an output control signal which is in turn applied to voltage control oscillator (VCO) 110, thereby adjusting the output frequency $F_{out}$ of VCO 110 in the appropriate direction to achieve and maintain frequency lock.

In perfect frequency and phase lock, phase/frequency detector 107 does not issue either up or down signals to charge pump 108 and thus no charge pumping action takes place. Operating in this closed loop manner, PLL frequency synthesizer 100 acts to maintain identical frequencies of the feedforward and feedback input signals provided to phase/frequency detector 107 by dividers 102 and 106, respectively. When this is the case, output frequency $F_{out}$ produced by VCO 110 is equal to the input reference frequency $F_{in}$ multiplied by the division factor (modulus) of feedback divider 106 and divided by the modulus of the reference input divider 102:

$$F_{out} = F_{in} \times (M/N) \quad (1)$$

where $F_{out}$ = is the frequency of the output signal available from VCO 110;

$F_{in}$ = is the frequency of the reference signal applied to lead 101;

M = is the division factor of feedback divider 106; and

N = is the division factor of feedforward divider 102.

Assuming a second order closed-loop system (for example, when a simple series resistor-capacitor low pass filter is employed as filter 109), the natural frequency and damping factor of PLL circuit 100 are described as:

$$\omega_n = \sqrt{\frac{\left(\frac{1}{M}\right)(I_{pump})(K_{vco})}{C_{filter}}} \quad (2)$$

where $\omega_n$ = the natural frequency of phase lock loop 100;

M = is the division factor of feedback divider 106;

$I_{pump}$ = is the magnitude of the charge pump current;

$K_{VCO}$ = is the voltage-to-frequency conversion gain associated with voltage controlled oscillator 110; and $C_{filter}$ = is the capacitance of low pass filter 109.

$$\zeta = \frac{(\omega_n)(R_{filter})(C_{filter})}{2} \quad (3)$$

where $\zeta$ = is the damping factor of phase lock loop frequency synthesizer 100; and $R_{filter}$ = is the resistance of low pass filter 109.

It can be seen from these equations that the natural frequency $\omega_n$ and thus the damping ratio $\zeta$ are inverse square root functions of the value of division factor M of feedback divider 106. It is not uncommon for M to have an operational range of 256:1 or greater in synthesizer applications, yielding $\omega_n$ and $\zeta$ variations over a range of 16:1, causing the lock acquisition time of PLL circuit 100 to vary greatly. In addition, $\zeta$ is an indicator of loop stability and has a practical minimum of approximately 0.5. Assuming $\zeta_{min}=0.5$, the above M range yields a maximum $\zeta=8$, resulting in a heavily overdamped loop, which is undesirable.

It is also known in the prior art to provide a selection of a small number of specific values for pump current $I_{pump}$. For example, in a prior art system, a high gain (high value of $I_{pump}$) is used to acquire lock, and a lower gain (i.e. lesser value of $I_{pump}$) is used after lock has been achieved, in order to maintain lock. This allows a rapid acquisition of lock by utilizing a high value of $I_{pump}$, but an increase in the jitter rejection by the use of a lower value $I_{pump}$ after lock has been achieved.

SUMMARY

In accordance with the teachings of this invention, a novel PLL frequency synthesizer is taught which utilizes circuitry for altering the magnitude of the pump current based upon the information in one or both of the division factors in the feedforward and feedback paths. In one embodiment, this magnitude of the pump current is varied in response to the division factor in the feedback path, providing a constant gain over a wide synthesized frequency range, thereby providing a constant natural frequency and constant damping in the frequency synthesizer.

In an alternative embodiment of this invention, the magnitude of the pump current is controlled as a function of the division factors in both the feedback and feedforward paths, thereby maintaining a constant natural frequency with respect to the output frequency.

In another embodiment, an exponentiating function is incorporated into the VCO so that the output frequency is proportional to the input voltage raised to a power. In this embodiment, the charge pump current is controlled as a function of the division factor in the feedforward path, thereby providing a natural frequency and thus a damping factor which is constant with respect to the output frequency.

In an alternative embodiment of this invention, gain control is provided as a function of one or both of the division factors in a PLL loop which does not utilize a charge pump for adjusting the output frequency of a voltage controlled oscillator. In one embodiment, a gain control circuit provides a gain control signal to the phase comparator in response to one or both of the division factors. In another embodiment, a gain control circuit provides a gain control signal to a variable frequency oscillator in response to one or both of the division factors. In another embodiment, a gain control circuit provides a gain control signal to one or more adjustable gain stages in the PLL.

DETAILED DESCRIPTION

Figure 2:
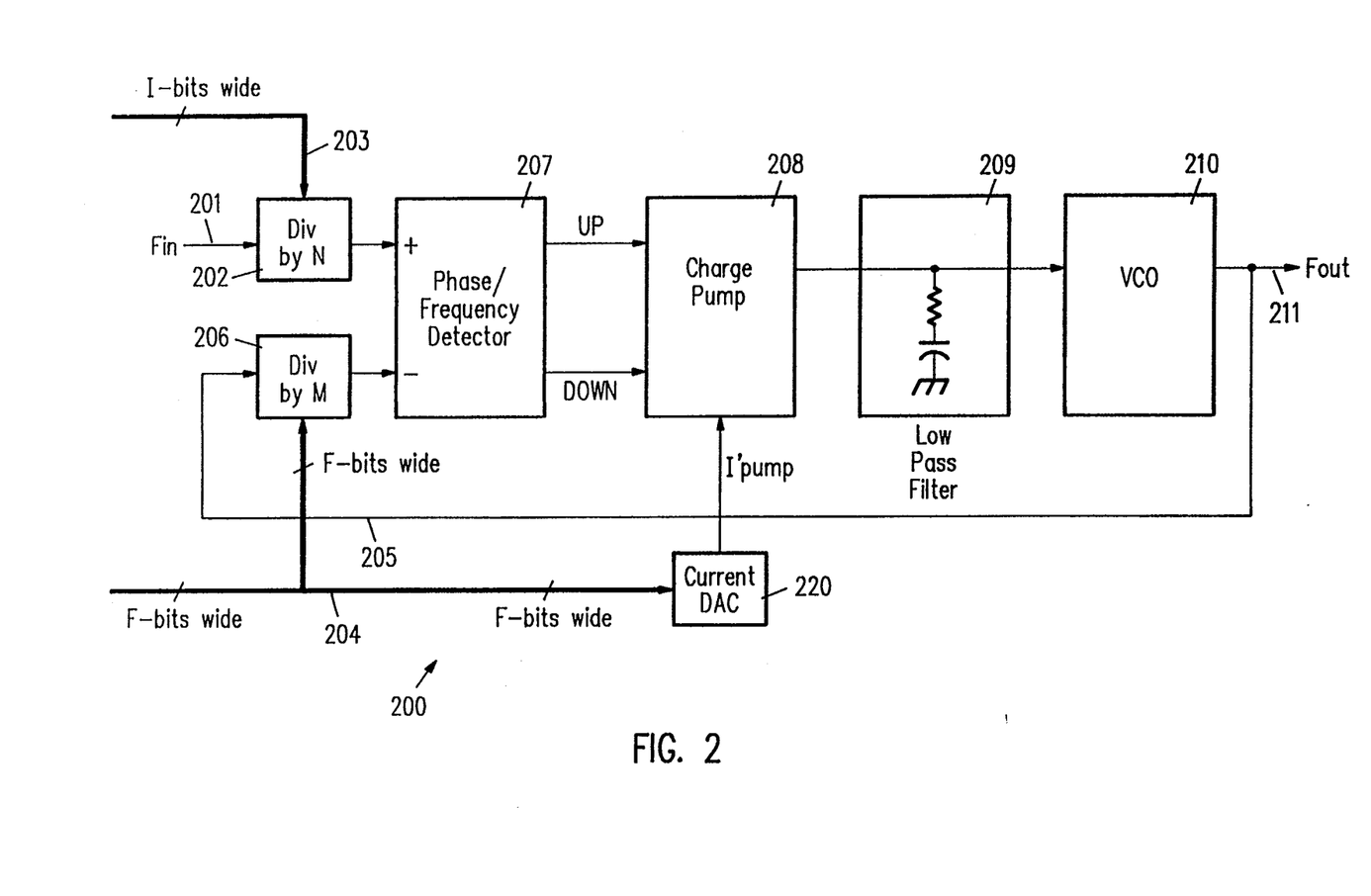
FIG. 2 is a block diagram of one embodiment of a PLL frequency synthesizer circuit constructed in accordance with the teachings of this invention.

FIG. 2 depicts a block diagram of a phase lock loop (PLL) frequency synthesizer 200 constructed in accordance with the teachings of this invention. PLL frequency synthesizer 200 operates in a similar fashion as circuit 100 of FIG. 1, although a significant improvement in performance is provided by utilizing current digital to analog converter (DAC) 220 to control the magnitude of the charge pump current $I'_{pump}$. In the embodiment shown in FIG. 2, current DAC 220 controls the value of $I'_{pump}$ in response to the value of the F bit word available on bus 204 which is used to define the division factor N of feedback divider 206. The value of the magnitude of the pump current is defined as:

$$I'_{pump} = M \times K_1 \qquad (4)$$

where $I'_{pump}$ is the magnitude of the charge pump current;

M = is the division factor defined by the F bit word available on bus 204; and $K_1$ = is a constant.

Thus, M and $I'_{pump}$ have a direct and linear relationship to one another and thus vary together. Combining equation (4) with equation (2) yields $$\omega_n = \sqrt{\frac{(K_1)(K_{vco})}{C_{filter}}} \qquad (5)$$

Thus, in accordance with the teachings of this invention, the natural frequency $\omega_n$ of PLL synthesizer 200 is now a constant with respect to frequency. Referring to equation 3, it is seen that if natural frequency $\omega_n$ has become a constant, so too has damping ratio $\zeta$. Thus, in accordance with the teachings of this invention, natural frequency $\omega_n$ and damping factor $\zeta$ of PLL synthesizer 200 are no longer dependent on the division factor N utilized by feedback divider 206. By providing a frequency synthesizing phase lock loop 200 which maintains a constant natural frequency $\omega_n$ and damping ratio q over a wide range of frequency operation, the inherent variability of lock acquisition time and loop stability of prior art circuits has been avoided.

In some phase locked loop configurations, an exponentiating function is incorporated into the VCO block such that the output frequency is proportional to the input voltage raised to a power, such that $F_{out} = (K) e^{Vin}$. The result is that the VCO gain is no longer a constant, but becomes proportional to the operating frequency:

$$K_{VCO} = K_O \times F_{out} \qquad (6)$$

where $K_O$ is a constant. Expressions for the natural frequency and damping ratio for such a loop are:

$$\omega_n = \sqrt{\frac{\left(\frac{1}{M}\right)(I_{pump})K_o(F_{out})}{C_{filter}}} \qquad (7)$$

$$\zeta = \frac{(\omega)(R_{filter})(C_{filter})}{2} \qquad (8)$$

Since $F_{out} = F_{in} \times (M/N)$, then $$\omega_n = \sqrt{\frac{\left(\frac{1}{M}\right)(I_{pump})K_o\left(\frac{M}{N}\right)(F_{in})}{C_{filter}}} \quad (9)$$

and thus $$\omega_n = \frac{\sqrt{\left(\frac{1}{N}\right)(I_{pump})K_o(F_{in})}}{C_{filter}} \quad (10)$$

Figure 3:
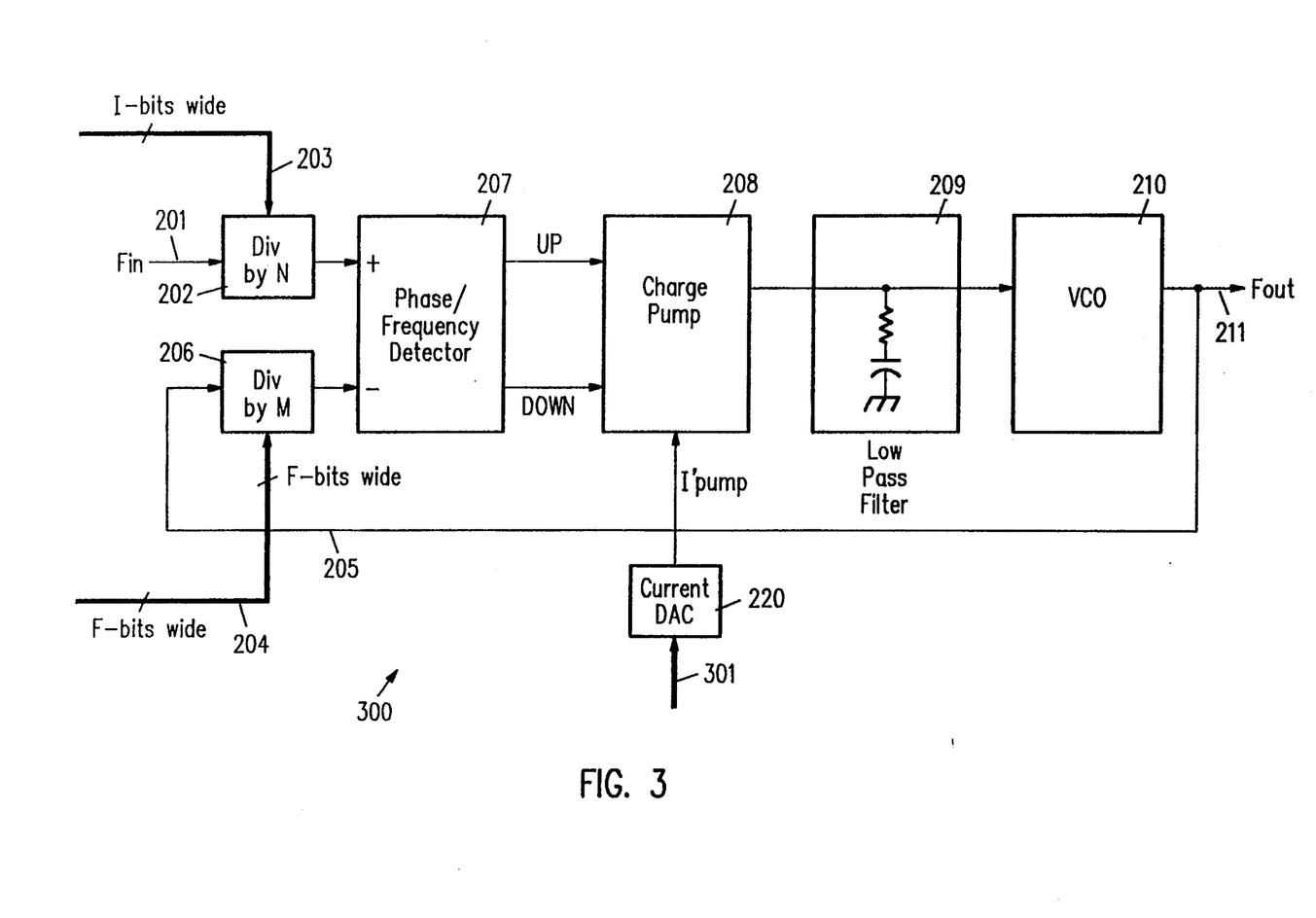
FIG. 3 is a block diagram of an alternative embodiment of a PLL frequency synthesizer circuit constructed in accordance with the teachings of this invention.

FIG. 3 is a block diagram depicting an alternative embodiment of this invention in which current DAC 220 is controlled by bus 301 as a function of both the factor N used by feedforward loop divider 202 and factor M used by feedback loop divider 206.

In one embodiment of this invention, these values N and M are manipulated by a microcontroller (not shown) to determine the appropriate digital word to be applied to current DAC 220 via bus 301. In an alternative embodiment of this invention, the values of the I bit word provided on bus 203 to feedforward loop divider 202 and the F bit word available on bus 204 to feedback loop divider 206 are made available to digital circuitry (not shown) either contained within current DAC 220 or external to it, to provide the appropriate digital control word to current DAC 220 to manipulate the magnitude of $I'_{pump}$ in relation to the division factors N and M.

In one embodiment of FIG. 3, the synthesizing PLL of FIG. 2 is reconfigured with the digital word defining division factor N fed into the charge pump current DAC, producing an $I'_{pump}$ current directly proportional to N:

$$I'_{pump} = N \times K_2 \quad (11)$$

where $K_2$ is a constant. Then Equation (10) becomes:

$$\omega_n = \frac{\sqrt{(K_2)(K_o)(F_{in})}}{C_{filter}} \quad (12)$$

In this embodiment, natural frequency $\omega_n$ is related only to constant (with $F_{in}$ being a constant reference frequency applied from a crystal oscillator, or the like) and thus is completely insensitive to changes in output frequency $F_{out}$, or division factors N or M. Since as shown in equation (3) damping factor $\zeta$ is related to $\omega_n$ and other constants, in this embodiment the damping factor is also unrelated to output frequency $F_{out}$, or division factors N and M.

The principle thrust of the invention is the use of the digital information which programs the feedforward and/or feedback dividers 202, 206 to modulate the loop gain of the PLL in such a way as to maintain constant natural frequency and $\omega_n$ damping factor $\zeta$. The invention now being fully described, it will be apparent to one of ordinary skill in the art that many changes and modifications can be made thereto without departing from the spirit or scope of the appended claims. For example, in alternative embodiments various portions of the PLL are formed in ways other than as discussed above, while the basic theme of this invention remains intact. For example, in one embodiment the charge pump based phase detector is replaced by another type of phase detector (e.g., four quadrant multiplier, exclusive OR, sample-and-hold, etc.), and thus the $I_{pump}$ term is replaced by a more generic gain term $K_{phase\ detector}$. Also, the DAC is not constrained to modulate the gain of the charge pump or phase detector; in one alternative DAC 220 instead modulates the gain of VCO 210 and/or another intervening gain block (not shown) placed into the loop.

Figure 4:
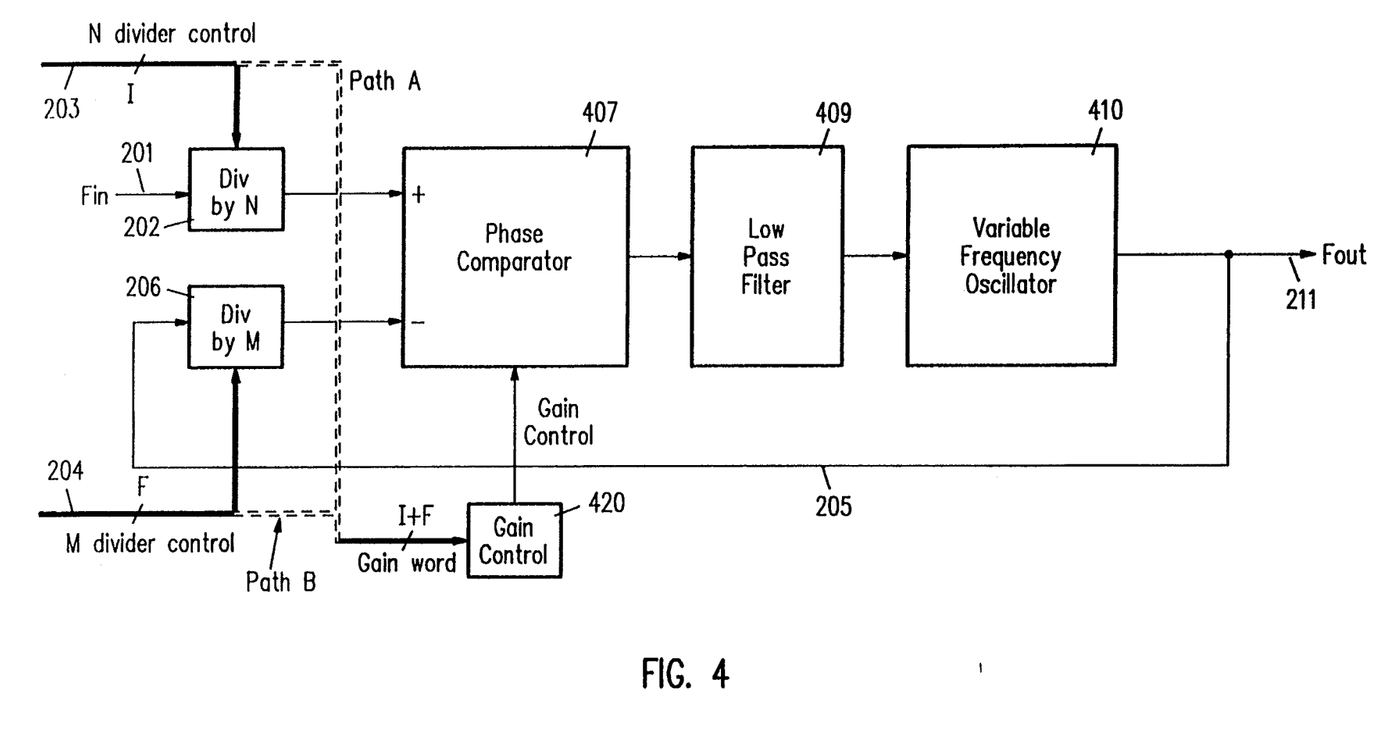
FIG. 4 is a block diagram of another embodiment of a PLL frequency synthesizer circuit constructed in accordance with the teachings of this invention in which gain control is provided without the use of a charge pump.

For example, FIG. 4 is a block diagram depicting an alternative embodiment of this invention in which a phase lock loop frequency synthesizer circuit is formed without the use of a charge pump, by including feedforward divider 202, feedback divider 206, phase comparator 407, low pass filter 409, and variable frequency oscillator 410. These components can be constructed in any desired manner, many such circuits being well known in the prior art. In accordance with the teachings of this invention, gain control circuit 420 receives one or both of the I bit and F bit words received on busses 203 and 204 to control the division factors of feedforward divider 202 and feedback divider 206, respectively. The gain control signal provided by gain control circuit 420 in response to one or both of the feedforward and feedback division factors may be applied to any block in the PLL which is configured to have externally varied gain as a function of the gain control signal (either analog or digital) from gain control circuit 420.

Thus, for example, in the embodiment of FIG. 4, gain control circuit 420 provides a gain control signal to phase comparator 407, phase comparator 407 having a gain factor which is controlled by the gain control signal provided by gain control circuit 420 in response to one or both of the division factors of the loop.

Figure 5:
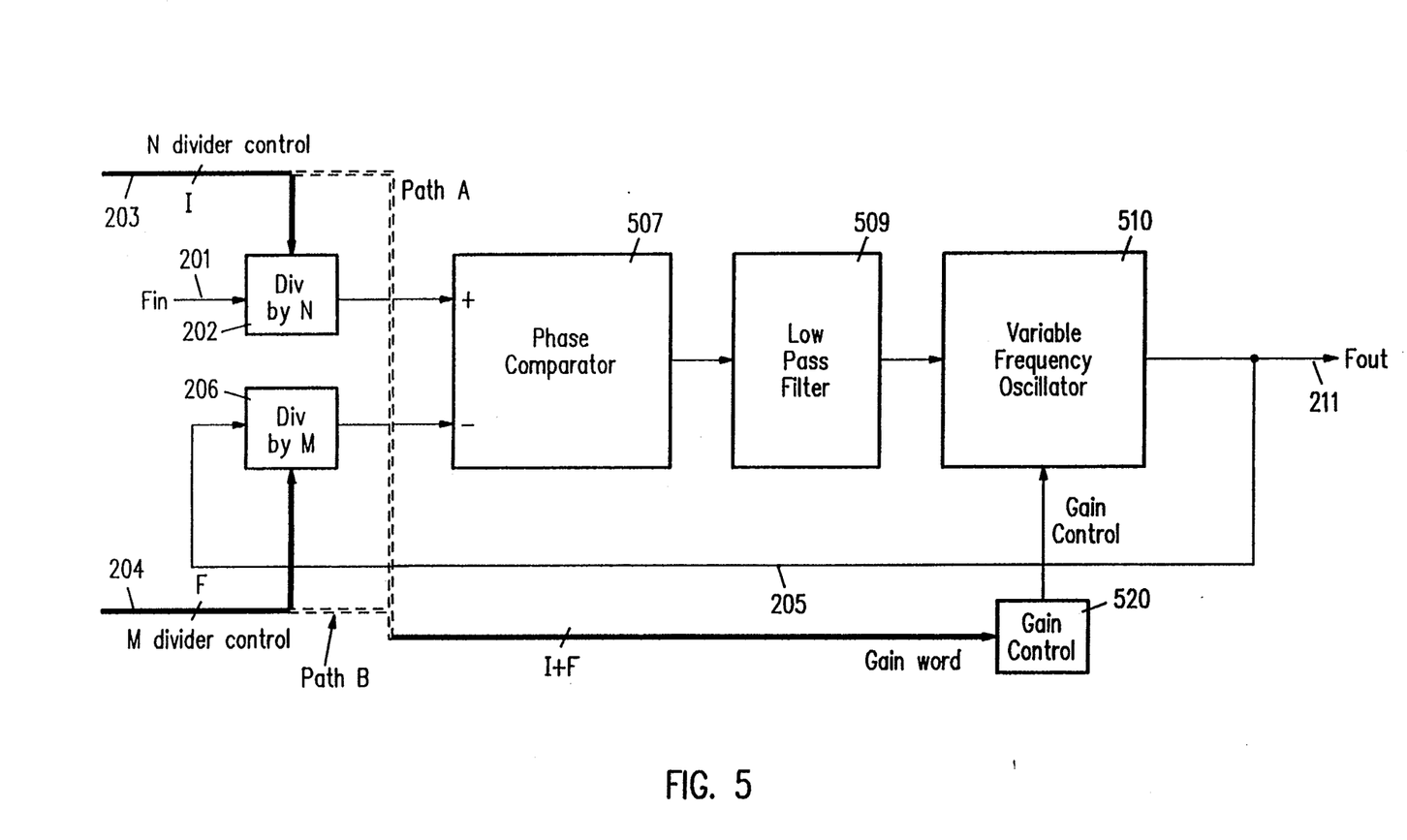
FIG. 5 is a block diagram depicting another embodiment of a PLL frequency synthesizer circuit constructed in accordance with the teachings of this invention in which gain control is provided by a variable frequency oscillator.

FIG. 5 is an alternative embodiment in which gain control circuit 520 is responsive to one or both of the division factors of the loop to provide a gain control signal (either analog or digital) to variable frequency oscillator 510, with variable frequency oscillator having a gain which is externally controllable by the gain control signal applied from gain control circuit 520.

If desired, low pass filter 509 can be constructed to have a gain which is externally controlled by a gain control signal made available from gain control circuit 520 or alternatively, one or more additional gain blocks (not shown) are inserted in the loop having a gain which is controlled by a gain control signal provided by gain control signal 520.

As one feature of this invention, the gain control signal provided in the embodiments of FIGS. 4 and 5 and their various alternatives thereto, is provided by gain control circuit 420 (FIG. 4) and gain control circuit 520 (FIG. 5) based upon the feedback division ratio M when the PLL gain characteristic is linear, and by the feedforward division factor N when the PLL gain characteristic is exponential. In either event, in accordance with the teachings of this invention, the result is a PLL having a desired constancy of closed loop natural frequency $\omega_n$. and damping ratio $\zeta$ as described above.

Figure 6:
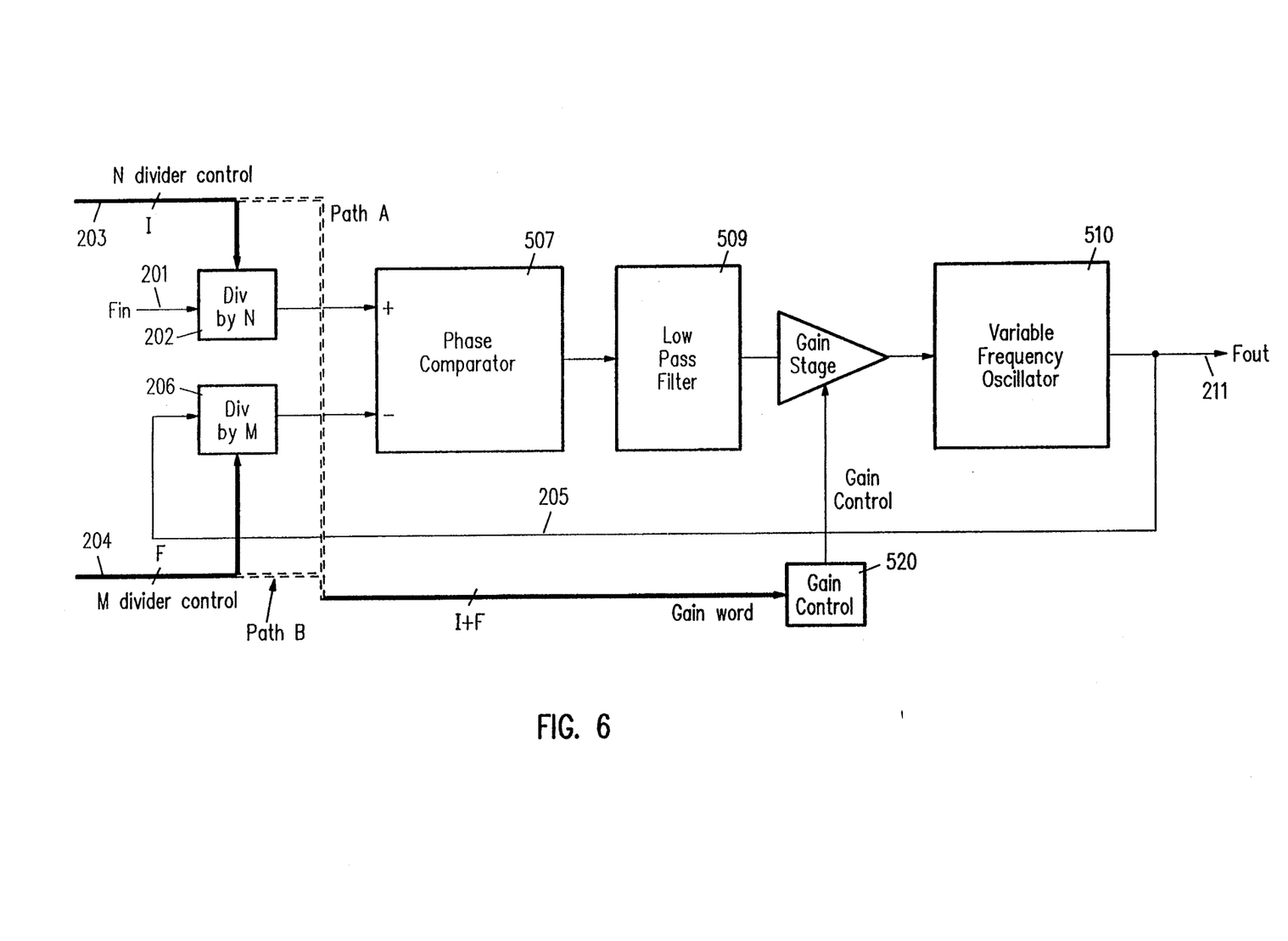
FIG. 6 is a block diagram depicting another embodiment of a PLL frequency synthesizer circuit construction in accordance with the teachings of this invention in which gain control is provided by a variable gain stage.

FIG. 6 is a block diagram depicting another embodiment of a PLL frequency synthesizer circuit construction in accordaqnce with the teachings of this invention in which gain control is provided by a variable gain stage.

I claim:

1. A frequency synthesizing circuit comprising:

an input terminal for receiving a reference signal having a reference frequency;

an output terminal for providing an output signal having an output frequency;

an error detector having a first input lead, a second input lead, and an output port for providing up-/down control signals;

a first divider responsive to a first division factor and having an input lead coupled to said input terminal and an output lead coupled to said first input lead of said error detector;

a second divider responsive to a second division factor and having an input lead coupled to said output terminal and an output lead coupled to said second input lead of said error detector;

a voltage controlled oscillator having an input lead for receiving a frequency control signal and an output lead coupled to said output terminal of said frequency synthesizing circuit;

a charge pump having a first input port coupled to said output port of said error detector for receiving said up/down control signals, an output lead coupled to said input lead of said voltage controlled oscillator, and a current control input lead for receiving a signal indicative of the magnitude of charge pump current to be used by said charge pump in providing a signal on said output lead of said charge pump in response to said up/down control signals from said error detector; and a control circuit responsive to said first division factor for providing said signal indicative to said current control input lead of said charge pump.

2. A circuit as in claim 1 wherein said control circuit comprises a current digital to analog converter and said signal indicative comprises a current provided by said control circuit.

3. A circuit as in claim 1 wherein said control circuit is also responsive to said second division factor.

4. A circuit as in claim 1 which further comprises a first bus for providing a signal to said first divider for specifying said first division factor.

5. A circuit as in claim 4 wherein said first bus also provides said signal for specifying said first division factor to said control circuit.

6. A circuit as in claim 3 which further comprises a first bus for providing a signal to said first divider for specifying said first division factor.

7. A circuit as in claim 6 wherein said first bus also provides said signal for specifying said first division factor to said control circuit.

8. A circuit as in claim 7 which further comprises a second bus for providing a signal to said second divider for specifying said second division factor.

9. A circuit as in claim 8 wherein said second bus also provides said signal for specifying said second division factor to said control circuit.

10. A frequency synthesizer circuit as in claim 1 wherein the gain of said frequency synthesizer is exponential.

11. A frequency synthesizing circuit comprising:
an input terminal for receiving a reference signal having a reference frequency;
an output terminal for providing an output signal having an output frequency;
an error detector having a first input lead, a second input lead, and an output port for providing up-/down control signals;

a first divider responsive to a first division factor and having an input lead coupled to said input terminal and an output lead coupled to said first input lead of said error detector;

a second divider responsive to a second division factor and having an input lead coupled to said output terminal and an output lead coupled to said second input lead of said error detector;

a variable frequency oscillator having an input lead for receiving a frequency control signal in response to said up/down control signals of said error detector and an output lead coupled to said output terminal of said frequency synthesizing circuit; and a gain control circuit responsive to said first division factor for providing a gain control signal to control the loop gain of said frequency synthesizing circuit.

12. A circuit as in claim 11 wherein one or more of said error detector and said variable frequency oscillator each have an externally controllable gain and a gain control input port coupled to receive said gain control signal from said gain control circuit.

13. A circuit as in claim 12 wherein said control circuit is also responsive to said second division factor.

14. A circuit as in claim 11 which further comprises a first bus for providing a signal to said first divider for specifying said first division factor.

15. A circuit as in claim 14 wherein said first bus also provides said signal for specifying said first division factor to said control circuit.

16. A circuit as in claim 13 which further comprises a first bus for providing a signal to said first divider for specifying said first division factor.

17. A circuit as in claim 16 wherein said first bus also provides said signal for specifying said first division factor to said control circuit.

18. A circuit as in claim 17 which further comprises a second bus for providing a signal to said second divider for specifying said second division factor.

19. A circuit as in claim 18 wherein said second bus also provides said signal for specifying said second division factor to said control circuit.

20. A circuit as in claim 11 which further comprises one or more gain stages within the portion of the loop which is closed upon itself for servo/negative feedback purposes.

21. A circuit as in claim 20 wherein one or more of said error detector, said variable frequency oscillator, and said one or more gain stages each have an externally controllable gain and a gain control input port coupled to receive said gain control signal from said gain control circuit.

22. A circuit as in claim 21 wherein said control circuit is also responsive to said second division factor.

23. A circuit as in claim 21 which further comprises a first bus for providing a signal to said first divider for specifying said first division factor.

24. A circuit as in claim 23 wherein said first bus also provides said signal for specifying said first division factor to said control circuit.

25. A circuit as in claim 22 which further comprises a first bus for providing a signal to said first divider for specifying said first division factor.

26. A circuit as in claim 25 wherein said first bus also provides said signal for specifying said first division factor to said control circuit.

27. A circuit as in claim 26 which further comprises a second bus for providing a signal to said second divider for specifying said second division factor.

28. A circuit as in claim 26 wherein said second bus also provides said signal for specifying said second division factor to said control circuit.

29. A frequency synthesizer circuit as in claim 11 wherein the gain of said frequency synthesizer is exponential.

30. A method for causing a phase lock loop to operate to synthesize an output signal having an output frequency comprising the steps of said phase lock loop:
receiving a reference signal having a reference frequency;
providing a first divided signal as a function of said reference signal and a first division factor;
providing a second divided signal as a function of said output signal and a second division factor;
comparing said first divided signal and said second divided signal and generating one or more error signals in response thereto;
controlling a variable frequency oscillator in response to said one or more error signals; and
controlling the gain of said phase lock loop in response to said first division factor.

31. A method as in claim 30 wherein said step of controlling the gain of said phase lock loop comprises the step of controlling the gain of at least one circuit selected from the group of circuits consisting of: a circuit used to perform said comparison, said variable frequency oscillator, or a gain stage within said phase lock loop.

32. A method as in claim 31 wherein said phase lock loop comprises a charge pump for receiving said one or more error signals and providing in response thereto an output signal for controlling said variable frequency oscillator, and wherein said step of controlling the gain of said phase lock loop comprises the step of controlling a magnitude of a pump current utilized by said charge pump.

33. A method as in claim 30 wherein said gain of said phase lock loop is exponential.

* * * * *